(12) United States Patent
McKinley et al.

(10) Patent No.: US 8,004,273 B1
(45) Date of Patent: Aug. 23, 2011

(54) SYSTEM FOR SIMPLIFIED CORRELATION OF INSTRUMENTATION PROBES AND DATA DISPLAYS

(75) Inventors: Patrick A. McKinley, Corvallis, OR (US); Gregory F. Carlson, Corvallis, OR (US); Steven M. Goss, Corvallis, OR (US)

(73) Assignee: Marvell International Ltd. (BM)

( * ) Notice: Subject to any disclaimer, the term of this patent is extended or adjusted under 35 U.S.C. 154(b) by 219 days.

(21) Appl. No.: 12/147,255

(22) Filed: Jun. 26, 2008

Related U.S. Application Data

(60) Provisional application No. 60/947,138, filed on Jun. 29, 2007, provisional application No. 60/947,152, filed on Jun. 29, 2007.

(51) Int. Cl.
*G01R 1/06* (2006.01)
*G01R 13/20* (2006.01)
*G01R 31/02* (2006.01)

(52) U.S. Cl. .................. 324/121 R; 324/72.5; 324/149
(58) Field of Classification Search .................. None
See application file for complete search history.

(56) References Cited

U.S. PATENT DOCUMENTS

| | | | | |
|---|---|---|---|---|
| 4,465,333 A * | 8/1984 | Caserta et al. | ........... | 385/73 |
| 4,869,566 A * | 9/1989 | Juso et al. | ........... | 385/53 |
| 5,235,268 A * | 8/1993 | Harthcock | ........... | 324/115 |
| 6,052,807 A * | 4/2000 | Nygaard, Jr. | ........... | 714/724 |
| 6,437,552 B1 * | 8/2002 | Sekel et al. | ........... | 324/72.5 |
| 6,731,104 B1 * | 5/2004 | Yang | ........... | 324/110 |
| 7,058,441 B2 * | 6/2006 | Shahar et al. | ........... | 600/475 |
| 7,366,584 B2 * | 4/2008 | Brodin et al. | ........... | 700/168 |
| 7,626,725 B2 * | 12/2009 | Fukusaka | ........... | 358/1.9 |
| 2003/0235379 A1 * | 12/2003 | Lin | ........... | 385/101 |

* cited by examiner

*Primary Examiner* — Paresh Patel

(57) ABSTRACT

A system for testing a device under test includes a probe that detects a signal from the device under test, a display device that depicts a trace based on the signal, where the trace exhibits an attribute, and an indicator that emits an indication signal based on the attribute.

19 Claims, 7 Drawing Sheets

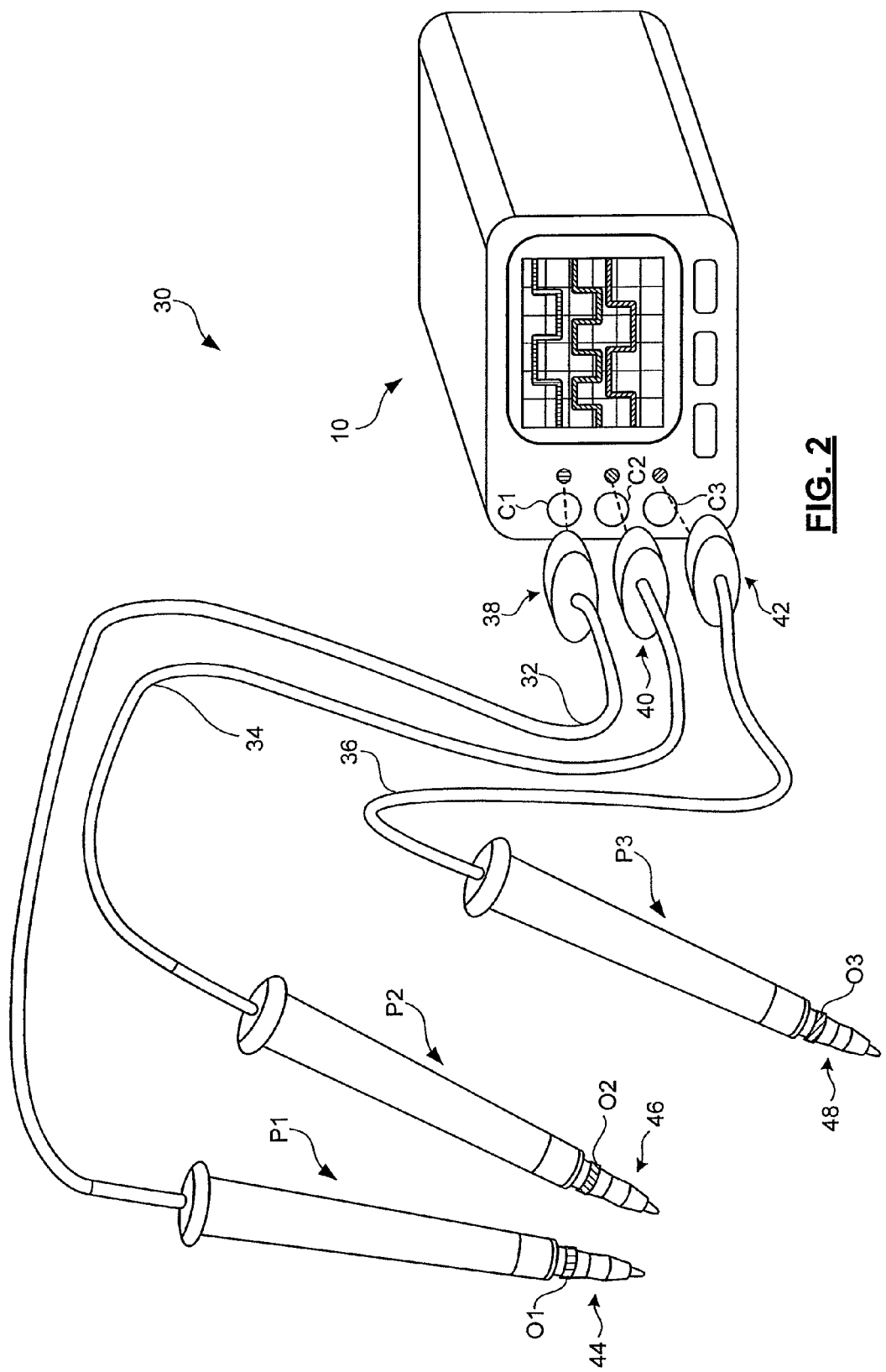

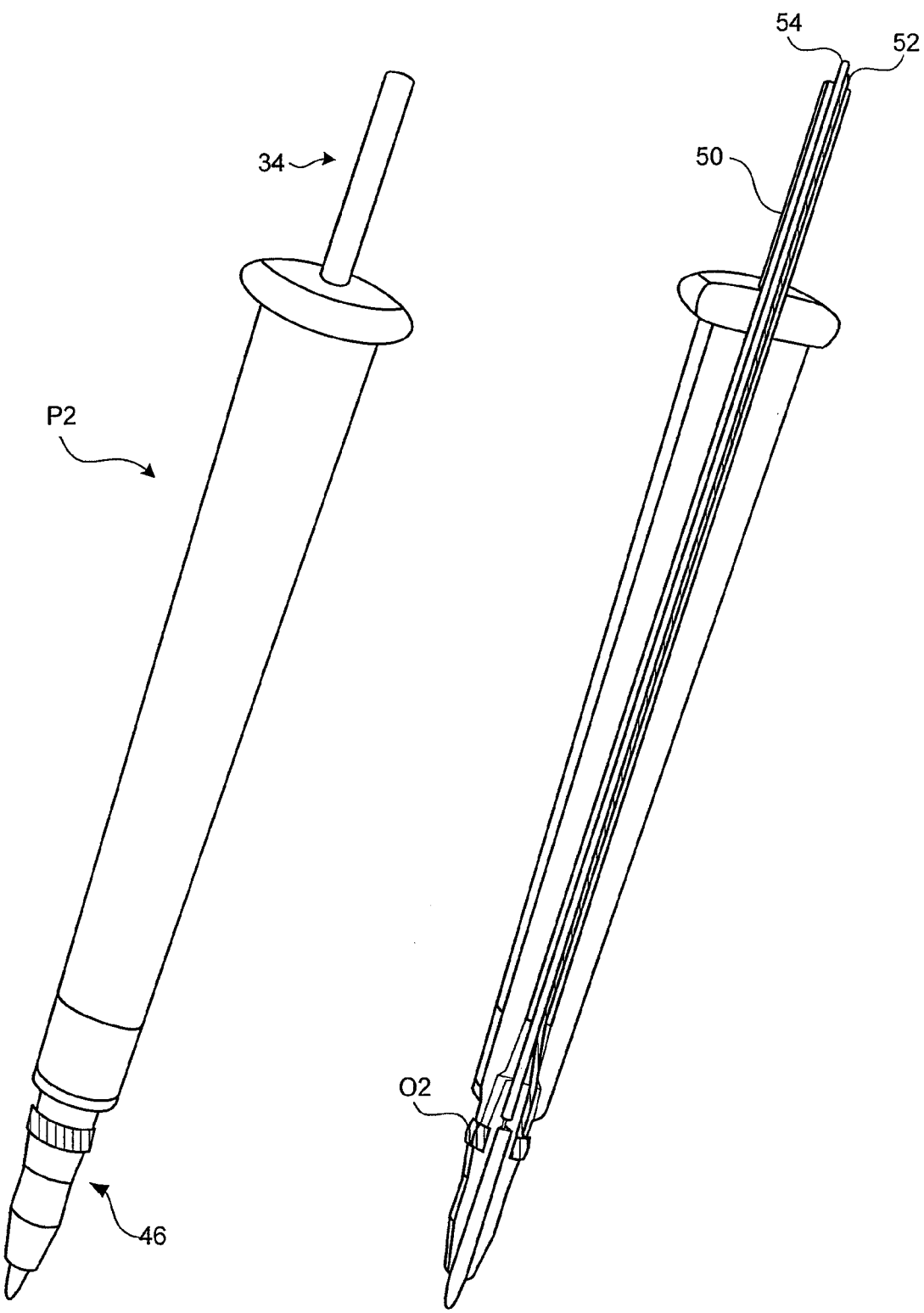
FIG. 3(a)  FIG. 3(b)

SYSTEM FOR SIMPLIFIED CORRELATION OF INSTRUMENTATION PROBES AND DATA DISPLAYS

RELATED APPLICATION

This application claims the benefit of U.S. Provisional Applications Nos. 60/947,138 and 60/947,152 both filed on Jun. 29, 2007, which are incorporated herein by reference.

BACKGROUND

1. Technical Field

The present disclosure relates generally to electronic test equipment and, more particularly, to enhanced operation of electronic test equipment.

2. Related Art

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Present instrumentation such as electronic test equipment is typically utilized to generate test signals and/or capture responses from an electronic device in order to determine proper operation of the electronic device. For example, oscilloscopes enable a user to view voltage signals depicted as waveforms at specific points of a device under test via a display device. The traces are generally graphically displayed as either a function of time or another voltage. Oscilloscopes may provide for multi-channel testing by including multiple input connectors for coupling to multiple test probes that respectively detect and transmit signals to the oscilloscope via respective connection cables.

These oscilloscopes use labeling schemes in order to correlate the connection cable input connector on the front panel to respective traces displayed on the display device. Although the signal sources (i.e., the multiple inputs provided on the oscilloscope) are correlated to the traces depicted on the display device via a labeling scheme, users may have a difficult time distinguishing between each of the signal traces and their respective measurement points in the circuit.

As mentioned above, various oscilloscopes allow for coupling to more than one test probe thereby enabling testing and/or monitoring of several channels simultaneously. Thus, in order to correlate each test probe to a respective input connector at the oscilloscope, predetermined colored "rings" (e.g., plastic bands) are attached at a first end of a connection cable (i.e., in close proximity to the associated input connector) and a second end of the connection cable (i.e., in close proximity to the test probe) that connects each test probe to a respective input connector. In this manner, a user can determine the relationship among the various tests probes and the various input connectors based on the color rings attached at either end of the connection cable. However, in order to correlate each input connector to a respective trace, a user must further rely on a labeling scheme as described above.

BRIEF SUMMARY

The present disclosure is defined by the following claims, and nothing in this section should be taken as a limitation on those claims.

By way of introduction, an embodiment below provides an electronic device that includes a display device that depicts a trace based on a signal received from a signal source, where the trace exhibits an attribute, and an indicator that emits an indication signal based on the attribute.

In other embodiments, the electronic device includes display means for depicting a trace based on a signal received from a signal source, where the trace exhibits an attribute, and further includes indicator means for emitting an indication signal based on the attribute.

In other features, an attribute of the emitted indication signal is substantially the same as the attribute of the trace. The attribute includes at least one of color, intensity, and illumination duration. The device further comprises an input connector that receives the signal, wherein the indicator is associated with the input connector. The attribute is one of programmable by a user of the electronic device and automatically programmable by the electronic device upon reception of the signal. The indication signal may comprise light.

Another embodiment provides a system for testing a device under test that includes a probe that detects a signal from the device under test, a display device that depicts a trace based on the signal, where the trace exhibits an attribute, and an indicator that emits and indication signal based on the attribute.

In other embodiments, the system for testing a device under test includes probe means for detecting a signal from the device under test, display means for depicting a trace based on the signal, where the trace exhibits an attribute, and indication means for emitting an indication signal based on the attribute.

In other features, the attribute includes at least one of color, intensity, and duration. The probe means includes optical indication means for emitting an absorbed indication signal based on the emitted indication signal from the indication means. An attribute of the absorbed indication signal from the optical indication means is substantially the same as the attribute of the trace.

In other features, the system further comprises input means, connection means having optical conduction means, and connector body means having optical reception means, where the connection means removably attaches to the input means via the connector body means and where the optical reception means absorbs the emitted indication signal from the indicator and the absorbed indication signal propagates in the optical conduction means. The probe means is coupled to the connection means and the optical conduction means communicates with the optical indication means of the probe means, wherein the optical indication means emits the absorbed indication signal.

In other features, the indication means is associated with the input connection means. The attribute is one of programmable by a user of the electronic device and automatically programmed by the electronic device upon reception of the signal. The indication signal may comprise light.

Other systems, methods, and features of the invention will be, or will become, apparent to one with skill in the art upon examination of the following figures and detailed description. It is intended that all such additional systems, methods, features and advantages be included within this description, be within the scope of the invention, and be protected by the following claims.

The preferred embodiments will now be described with reference to the attached drawings.

BRIEF DESCRIPTION OF THE DRAWINGS

FIG. 2 illustrates a system that includes the exemplary ETD and a plurality of exemplary probes according to the present disclosure;

FIG. 3(a) is a side view of an exemplary probe according to the present disclosure;

FIG. 3(b) is a cross-sectional view of the exemplary probe according to the present disclosure;

DETAILED DESCRIPTION OF THE PRESENTLY PREFERRED EMBODIMENTS

The disclosure can be better understood with reference to the following drawings and description. The components in the figures are not necessarily to scale, emphasis instead being placed upon illustrating the principles of the invention. Moreover, in the figures, like referenced numerals designate corresponding parts or elements throughout the different views. The following description is merely exemplary in nature and is in no way intended to limit the disclosure, its application, or uses. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

By way of introduction, the embodiments described herein are related to various embodiments of electronic test devices and systems that provide for graphical "tracing" of multiple signal sources on a display device of an electronic test device. The present disclosure describes electronic test devices which enable a user to customize a correlation between waveforms depicted on a display device ("traces") of an electronic test device and their respective signal sources, thereby enhancing the operation and ease of use of the electronic test device and the electronic test system as a whole.

Figure 1:
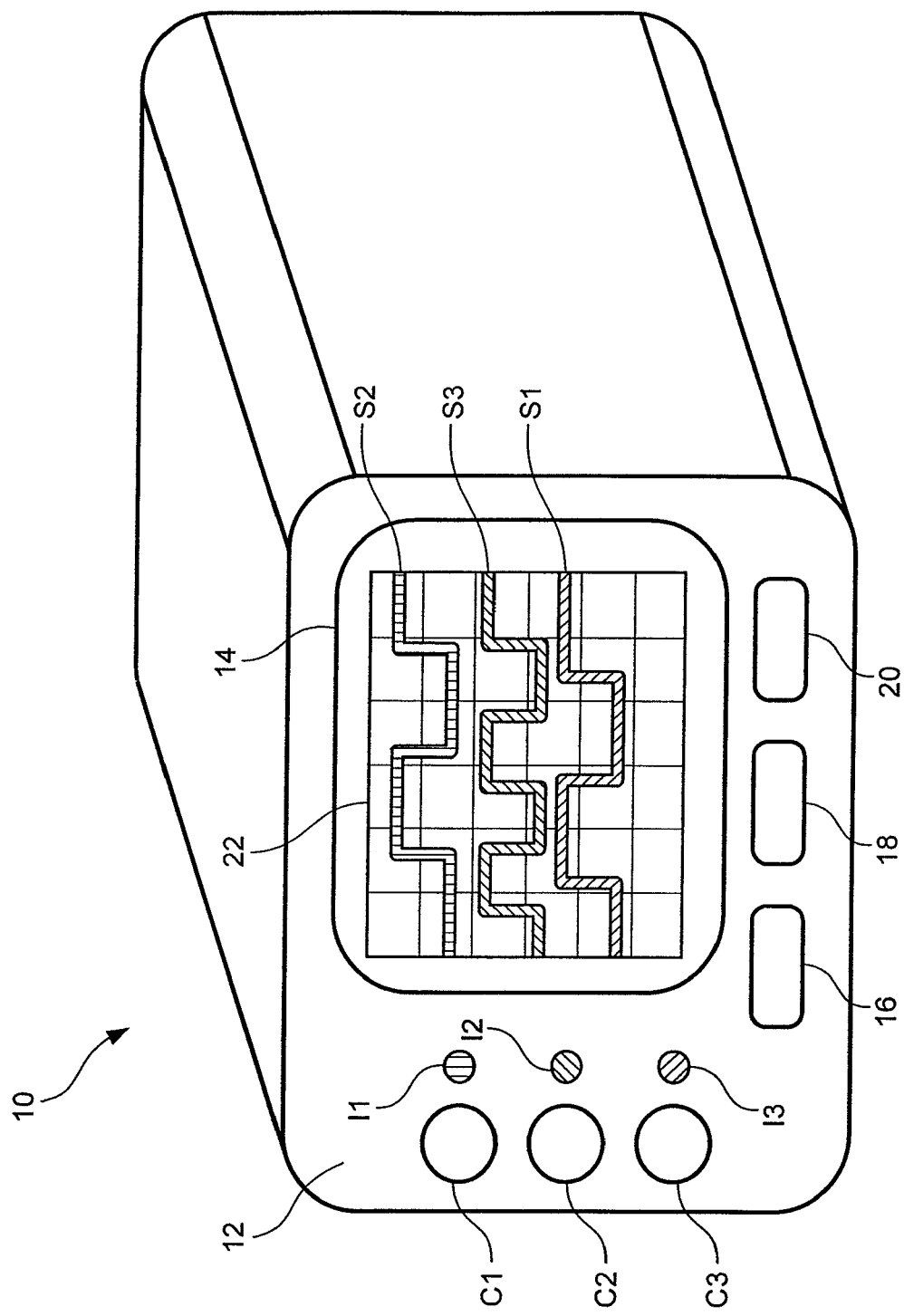
FIG. 1 is a front view of an exemplary embodiment of an equipment test device (ETD) according to the present disclosure.

Referring now to FIG. 1, an exemplary electronic test device (ETD) 10 is shown in more detail. In the present implementation, the electronic test device comprises an oscilloscope, though the present disclosure anticipates various other embodiments. The ETD 10 may implement a correlation system of the present disclosure. The ETD 10 includes a panel 12 having a display panel 14, input connectors (e.g. cable connectors) C1, C2, and C3, referred to collectively as the input connectors, indicators I1, I2, and I3, referred to collectively as the indicators, and configuration control modules 16, 18, and 20, referred to collectively as the configuration control modules. Although the present implementation depicts sets of three connectors, indicators, and configuration control modules, respectively, the ETD 10 may include a variable number of each of the connectors, the indicators, and the configuration control modules.

The display device 14 typically includes a grid 22. In the present implementation the display device 14 depicts traces S1, S2, and S3, referred to collectively as the traces, plotted on the grid 22. Each of the traces respectively represents voltage signals at specific points on a device (not shown) that is being tested. Each of the traces is generally graphically displayed as either a function of time or another voltage.

The input connectors are each "fed" (i.e., receive) a distinct signal to be measured via an external signal measurement device (not shown). Exemplary signal measurement devices such as probes are described in more detail below. Each trace illustrated on the display device 14 respectively corresponds to a distinct signal received via one of the connectors. For example, in the present implementation, the traces S1, S2, and S3 correspond to signals received at input connectors C1, C2, and C3, respectively. In accordance with the present disclosure, each of the traces possesses a distinct variation of an attribute of light such as, but not limited to, color, intensity, and periodic illumination (e.g., "blinking" or on-off sequences). Those skilled in the art will appreciate that the present disclosure contemplates combinations of various attributes. In the present implementation, each trace exhibits a distinct color, thereby being readily distinguishable to a user (not shown).

As illustrated in FIG. 1, each of indicators (e.g., light-emitting diodes) is positioned substantially adjacent to its associated input connector in order to make the correlation readily apparent to a user. For example, in the present implementation, the indicators I1, I2, and I3 are associated with the input connectors C1, C2, and C3, respectively. Each indicator is associated with a particular trace illustrated on the display device 14 of the ETD 10 such that each indicator emits light based on the attribute exhibited by the associated trace. In various embodiments, each of the indicators may replicate the same attribute, or substantially the same attribute, as exhibited by a respective trace. For example, the trace S1 is depicted on the display device 14 with a first color (e.g., red). The indicator I1 emits light based on the trace S1. In other words, in the present example, the indicator I1 emits a red light, thereby enhancing the ability of a user to correlate the input connector C1, positioned adjacent to the indicator I1, with the trace S1. In the event that a user has difficulty distinguishing between distinct colors (e.g., when a plurality of signal sources are being monitored), a trace may be configured to be plotted as a "dashed" line. In accordance with a "dashed" trace, the light emitted by the associated indicator may be modulated in order to generate an ON-OFF sequence of illumination.

In the present implementation, the indicators include programmable light-emitting diodes (LEDs) that enable a user of the ETD 10 to selectively assign a distinct attribute to a particular trace (i.e., allowing a user to associate a particular signal source with a distinct attribute) via the configuration control modules. In similar fashion, after each trace is assigned a respective attribute, the ETD 10 provides for synchronization between the respective trace and the indicator associated with input connector receiving the signal.

The ETD 10 may also automatically assign a distinct attribute to each respective trace. In other words, the attributes of each the traces may be user-defined or system-defined. In various embodiments, each of the configuration control modules may control the attribute characteristics of a respective trace as well as its associated indicator. In other embodiments, the configuration control modules may be implemented as a single controller.

Referring now to FIG. 2, a system 30 including the exemplary ETD 10 and probes P1, P2, and P3, referred to collectively as the probes, is shown. The probes P1, P2, and P3 communicate with the ETD 10 at the input connectors C1, C2, and C3, respectively, via connection cables 32, 34, and 36. The connection cables 32, 34, and 36 are removably attached to the input connectors C1, C2, and C3, respectively, via connector bodies 38, 40, and 42, respectively. The connections between the probes and input connectors will be described in more detail in FIGS. 4(a) and 4(b). Those skilled in the art will appreciate that the input connectors may be disposed on other panels (e.g., sides or surfaces) of the ETD 10. For example, the connection cables 32, 34, and 36 may be removably attached to the ETD 10 at various other physical portions (e.g., a backplane or back panel) of the exemplary ETD 10. In yet other embodiments, the connection cables 32, 34, and 36 may be fixedly attached to the ETD 10 such that each respective fixed attachment point of the connection cables 32, 34, and 36 transmit the electrical and optical signals through the connection cables 32, 34, and 36.

Optical indicators O1, O2, and O3 (e.g., optical diffusion rings) are attached in close proximity to each probe tip 44, 46, and 48, respectively. The probe tips come into direct contact with a device under test (i.e., the signal source of a trace). Therefore, during use of the probes, the optical indicators O1, O2, O3, referred to collectively as the optical indicators, remain readily visible to a user and function to exhibit an attribute (e.g., a distinct color) based on an associated trace depicted on the display device 14. In the present implementation, the optical indicators include moldable material that can absorb and retransmit light such as various plastic materials. Additionally, the optical indicators include a ring structure formed about the circumference of each respective probe tip although other structures are contemplated by the present disclosure.

Referring now to FIGS. 2, 3(a), and 3(b), the probe P2 is described in more detail. FIG. 3(a) illustrates a side view of the probe P2 and FIG. 3(b) illustrates a cross-sectional view of the probe P2. As depicted, the connection cable 34 is coupled to the probe P2. The connection cable 34 includes an exterior sheathing 50 and coaxial, optical and electrical conductors 52, 54 that run the length of the connection cable 34. The connection cable 34 continues through the interior of the probe P2 in the direction of the probe tip 46. In the present implementation, the exterior sheathing 50 terminates in the vicinity of the probe tip 46 and the optical and electrical conductors 52, 54 terminate such that optical and electrical communication is established with the probe tip 46. The optical conductor 52 (e.g., optical conduction fiber) transmits optical energy and therefore does not interfere with electrical signals transmitted over the electrical conductor 54.

During operation, the probe tip 46 detects an electrical signal from a signal source (i.e., a point of a device under test) which is then transmitted to the ETD 10 via the electrical conductor 54. The ETD 10 generates the trace S2 based on the sampled electrical signal. As previously discussed, each trace is characterized by a distinct color. In the present example, trace S2 is depicted on the display device 14 using a red trace. Accordingly, the indicator I2 is illuminated with a red light. The connector body 46 redirects the light emitted from the indicator I2. The red light is transmitted down the length of the probe P2 via the optical conductor 52 (e.g., an optical "light pipe") and diffused into the optical indicator O2, thereby emitting light with the same attribute (e.g., red color) as utilized to plot the trace S2 on the display device 14. Those skilled in the art will appreciate that probes P1 and P3 include substantially similar elements and operate in similar fashion as probe P2.

Figure 4A:
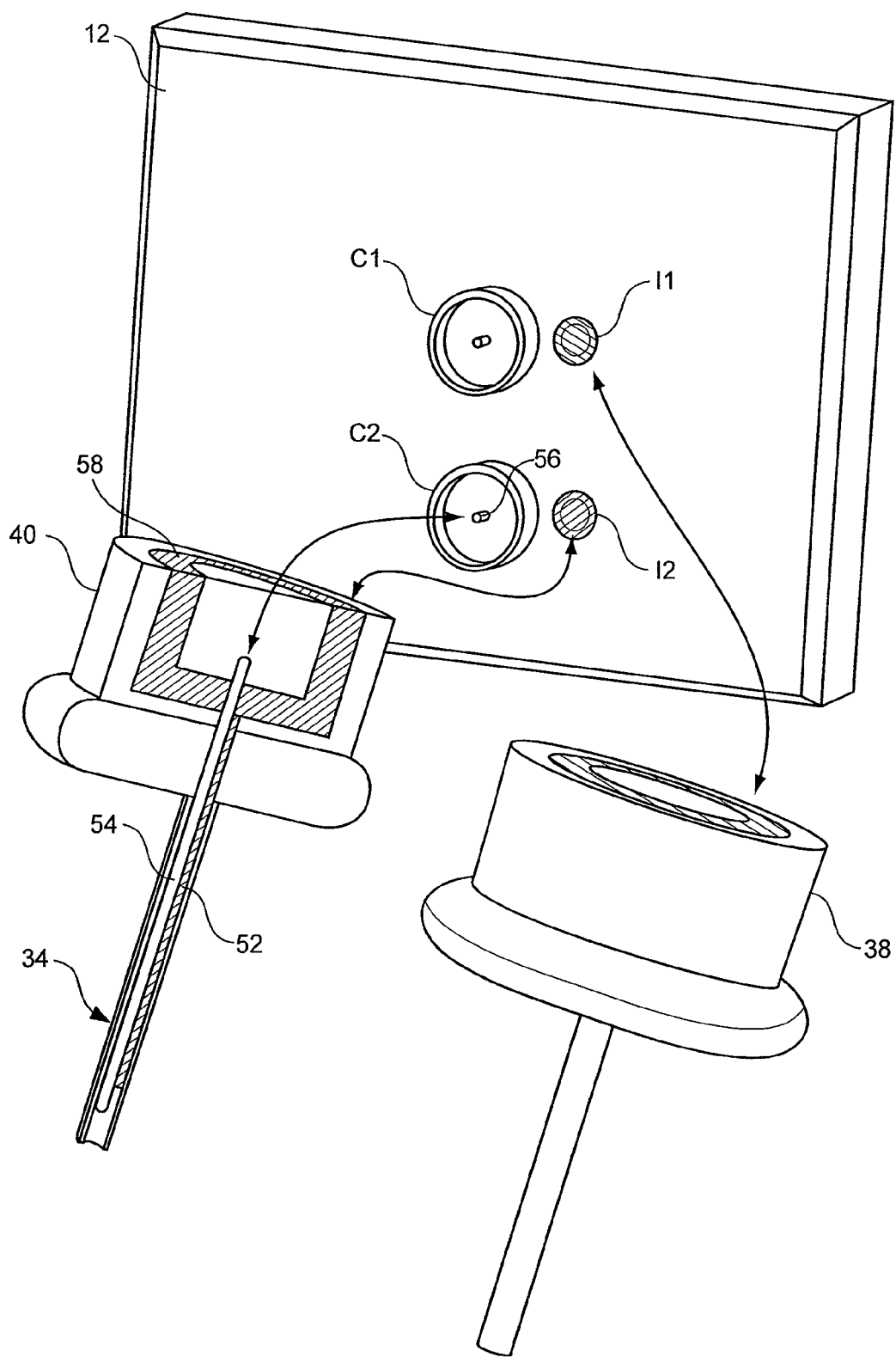
FIG. 4(a) is an embodiment of a panel of the exemplary ETD according the present disclosure.

Referring now to FIGS. 3(b) and 4(a), a first embodiment of the panel 12 of an exemplary ETD (not shown) depicting respective connections between connector bodies 38, 40 and connectors C1, C2 is shown. A side view of the connector body 38 and a cross-sectional view of the connector body 40 are depicted in FIG. 4(a). For the sake of simplicity and brevity, the present disclosure will discuss the elements and operation of the connector body 40 and its connection with the connector C2, though those skilled in the art will appreciate that the elements and operation of connector body 38 and its connection with connector C1 are substantially similar. Additionally, although the present embodiment depicts two connector bodies and two connectors, the panel 12 may include a variable number of connector bodies and connectors.

In the present implementation, the connector body 40 removably attaches to the connector C2 thereby enabling electrical communication between a pin 56 of the connector C2 and the electrical conductor 54. Additionally, the connector body 40 is positioned relative to the connector C2 so that an optical receptor ring 58 of the connector body 40 absorbs light emitted from the indicator I2. In other words, the optical receptor ring 58 absorbs light based on the attribute of an associated trace (not shown). The optical receptor ring 58 channels the absorbed light to the optical conductor 52. The absorbed light is then transmitted towards the optical indicator O2 via the connection cable 34. Like the optical indicators, the optical receptor ring 58 includes diffusion material that can be molded into various configurations.

The connector body 40 is typically constructed with an opaque material. In various embodiments, the connector body 40 may include a relatively small aperture that exposes the attribute of the absorbed light at the panel 12, in close proximity to the display device 14 of the ETD 10. In other embodiments, the panel 12 of the ETD 10 may include two respective indicators associated with each input connector on the panel 12. In such an embodiment, one indicator may emit light that is absorbed by the optical receptor ring 58 of the connector body 40, as described above, and the second indicator may be left completely visible to a user of the ETD 10.

Figure 4B:
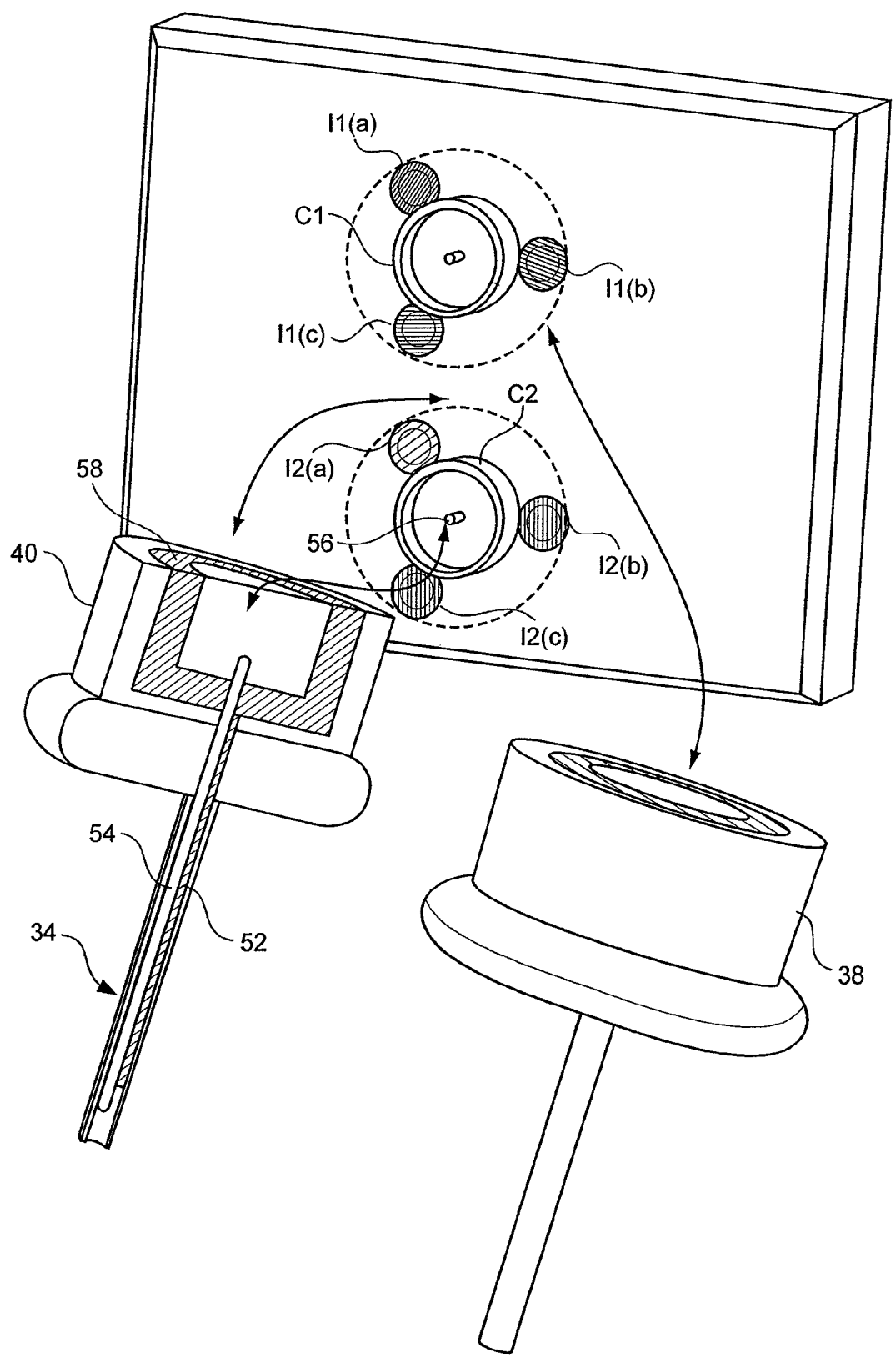
FIG. 4(b) is another embodiment of the panel of the exemplary ETD according the present disclosure.

Referring now to FIGS. 3(b) and 4(b), a second embodiment of the panel 12 of the exemplary ETD 10 depicting respective connections between connector bodies 38, 40 and input connectors C1, C2 is shown. A side view of the connector body 38 and a cross-sectional view of the connector body 40 are depicted in FIG. 4(b). For the sake of simplicity and brevity, the present disclosure will discuss the elements and operation of the indicators I2(a), I2(b), and I2(c), referred to collectively as the indicators, associated with the input connector C2 though those skilled in the art will appreciate that the elements and operation of indicators I1(a), I1(b), and I1(c) associated with input connector C1 are substantially similar. Additionally, although the present embodiment depicts two connector bodies and two connectors, the panel 12 may include a variable number of connector bodies and connectors.

In the present embodiment, the panel 12 includes multiple (e.g., three) indicators associated with each of the connectors C1 and C2. Each of the indicators respectively emits a single color when activated. The intensity of each color emission from the respective indicators can be controlled by a user via the configuration control modules. In this embodiment, the optical receptor ring 58 absorbs and "mixes" the respective light emitted from each of the indicators I2(a), I2(b), and I2(c) in order to generate a desired attribute (e.g., color). The mixed light is then propagated through the probe P2 to the optical indicator O2 as described above. The mixed light may include any combination of light emitted from indicators I2(*a*), I2(*b*), and I2(*c*). Also, although three indicators are depicted, a variable number of indicators associated with each input connector are anticipated.

In other embodiments, each of the indicators I2(*a*), I2(*b*), and I2(*c*) may be operated (i.e., illuminated) in various sequences and/or durations in order to generate patterns of light to match similar patterns respectively characterizing each associated trace plotted on the displace screen 12 as described in FIG. 1.

Figure 5A:
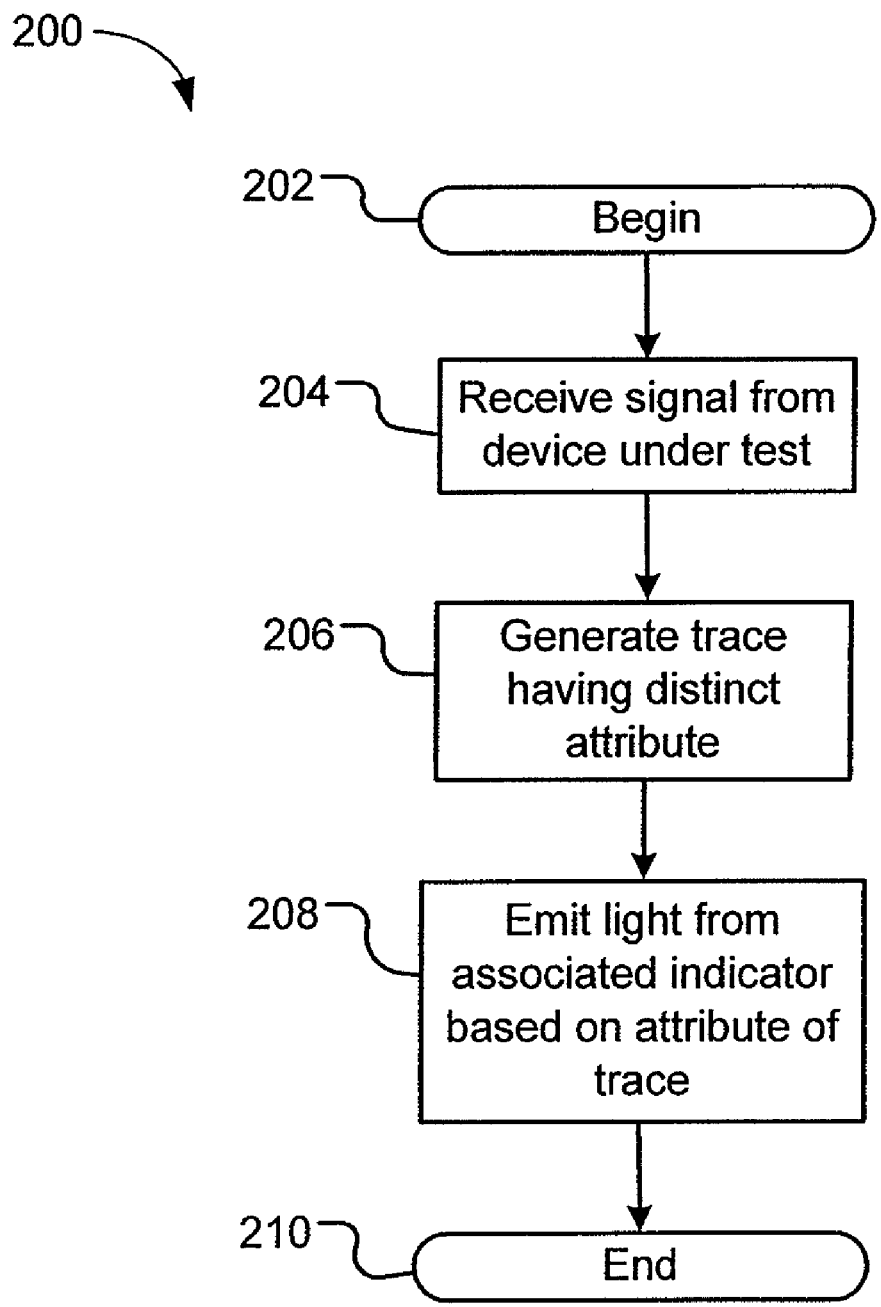
FIG. 5(a) is a flow diagram illustrating the operation of an exemplary correlation system of the exemplary ETD according to the present disclosure.
Figure 5B:
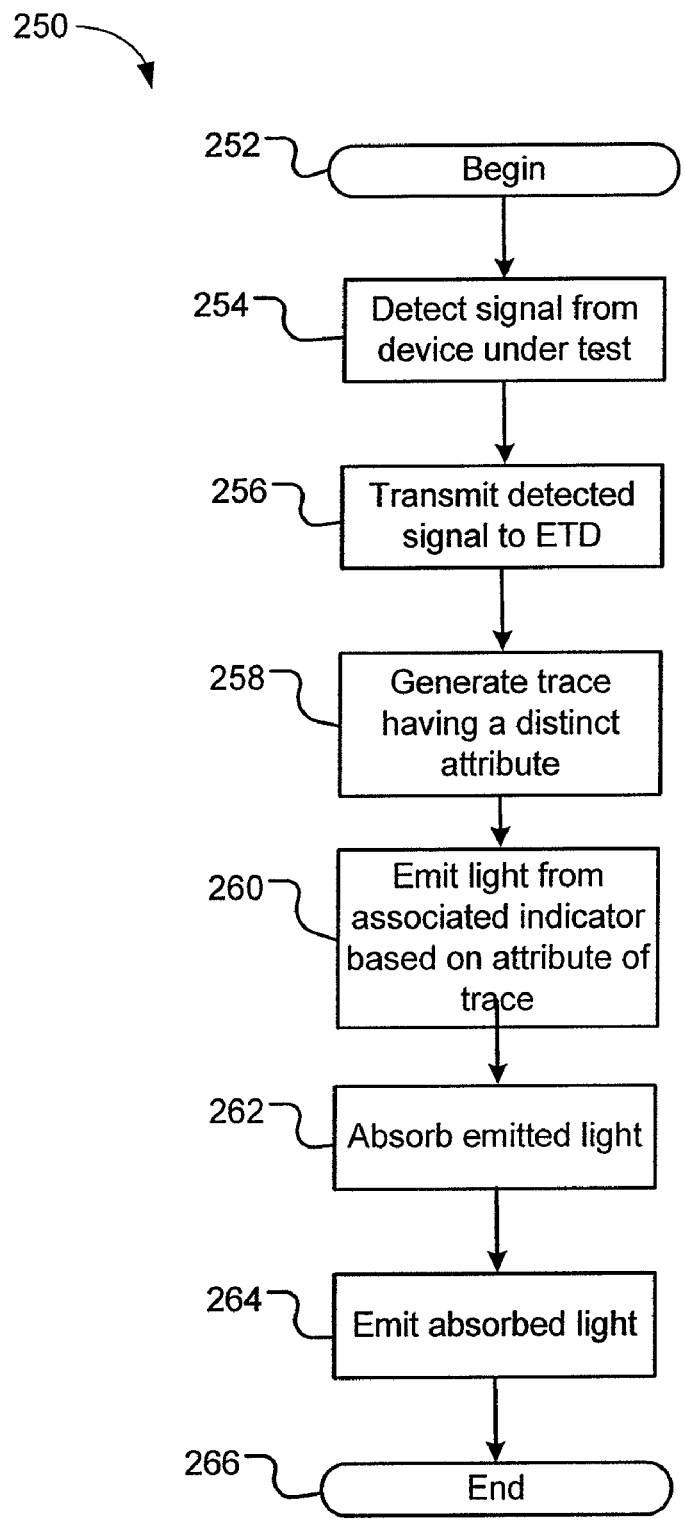
FIG. 5(b) is a flow diagram illustrating the operation of an exemplary correlation system of the system that includes the exemplary ETD and a plurality of exemplary probes according to the present disclosure.

Referring now to FIG. 5(*a*), a method 200 illustrating the operation of the exemplary correlation system of the ETD 10 is shown in more detail. The method 200 begins in step 202. In step 204, the ETD 10 receives a signal from a device under test at an input connector C1. In step 206, the ETD 10 generates a trace S1 having a distinct attribute based on the received signal. In step 208, the indicator I1 associated with the input connector C1 emits light based on the characteristic attribute of the trace S1. In step 210, the method 200 ends.

Referring now to FIG. 5(*b*), a method 250 illustrating the operation of the exemplary correlation system of the system including the ETD 10 and the probe P2 is shown in more detail. The method 250 begins in step 252. In step 254, the probe P2 detects a signal at a point on a device under test. In step 256, the probe P2 transmits the detected signal to the ETD 10. In step 258, the ETD 10 generates a trace S2 having a distinct attribute based on the received signal. In step 260, the indicator I2 associated with the input connector C2 emits light having a characteristic attribute based on the trace S2. In step 262, the optical receptor ring 58 of the probe P2 absorbs the light emitted from the indicator I2. In step 264, the optical indicator O2 of the probe P2 emits the absorbed light. In step 266 the method 250 ends.

All of the discussion above, regardless of the particular implementation being described, is exemplary in nature, rather than limiting. Although specific components of the correlation system are described, methods, systems, and articles of manufacture consistent with the correlation system may include additional or different components. For example, components of the correlation system may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the correlation system may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the invention can take and not as a definition of the invention. It is only the following claims, including all equivalents, that are intended to define the scope of this invention.

What is claimed is:

1. An electronic device, comprising:
   a display device that depicts a waveform based on a signal received from a signal source, where the waveform exhibits an attribute;
   an indicator that generates an indication signal based on the attribute; and
   an interface comprising:
   a data input configured to receive the signal, the signal being used to display the waveform on the display device; and
   an optically coupled output configured to transmit the indication signal from the indicator.

2. The device of claim 1 wherein an attribute of the generated indication signal is substantially the same as the attribute of the waveform.

3. The device of claim 1 wherein the attribute includes at least one of color, intensity, and illumination duration.

4. The device of claim 1 wherein the attribute is programmable by a user of the electronic device.

5. The device of claim 1 wherein the indication signal comprises light.

6. The device of claim 1, further comprising an optical conductor configured to transmit the indication signal from the optically coupled output of the interface.

7. The device of claim 1, wherein the interface is configured to interface with a probe that detects the signal from the signal source.

8. The device of claim 7, wherein the attribute exhibited by the waveform is color, and
   wherein the indicator is configured to select a color from a plurality of colors and to generate the indication signal with the selected color in response to the attribute being color.

9. The device of claim 8, wherein the optically coupled output of the interface is optically coupled to an optical receptor of the probe and transmits the indication signal with the selected color to the probe.

10. The device of claim 8, wherein the waveform is a first waveform based on a first signal from a first signal source, where the first waveform exhibits a first color,
    wherein the indicator is a first indicator that generates a first indication signal with the first color,
    wherein the interface is a first interface comprising a first optically coupled output configured to transmit the first indication signal from the first indicator,
    wherein the display device depicts a second waveform based on a second signal received from a second signal source, where the second waveform exhibits a second color, and
    wherein the device further comprises:
    a second indicator that generates a second indication signal with the second color, and
    a second interface comprising a second optically coupled output configured to transmit the second indication signal from the second indicator.

11. The device of claim 10, wherein the second interface is configured to interface with a second probe that detects the second signal from the second signal source.

12. The device of claim 11, wherein the second indicator is configured to generate the second indication signal in response to the second waveform exhibiting the second color.

13. The device of claim 12, wherein the second optically coupled output of the second interface transmits the second indication signal with the second color to the second probe.

14. A method for controlling an electronic device, comprising:
- receiving a signal from a signal source at a data input of an interface;
- depicting a waveform based on the received signal, where the waveform exhibits an attribute;
- generating an indication signal based on the attribute; and
- transmitting the indication signal via an optically coupled output of the interface wherein the waveform is depicted on a display device.

15. The method of claim 14 wherein an attribute of the generated indication signal is substantially the same as the attribute of the waveform.

16. The method of claim 14 wherein the attribute includes at least one of color, intensity, and illumination duration.

17. The method of claim 14 further comprising associating the signal source with the generated indication signal based on an association between the interface and an indicator, where the interface receives the signal and the indicator generates the indication signal.

18. The method of claim 14 wherein the attribute is programmable by a user of the electronic device.

19. The method of claim 14 wherein the indication signal comprises light.

* * * * *